United States Patent
Robertson

(10) Patent No.: US 6,765,942 B2
(45) Date of Patent: Jul. 20, 2004

(54) OPTOELECTRONIC CIRCUIT AND CONTROL CIRCUIT

(75) Inventor: Guy James Robertson, Ipswich (GB)

(73) Assignee: Agilent Technologies Inc., Palo Alto, CA (US)

( * ) Notice: Subject to any disclaimer, the term of this patent is extended or adjusted under 35 U.S.C. 154(b) by 0 days.

(21) Appl. No.: 10/154,906

(22) Filed: May 28, 2002

(65) Prior Publication Data

US 2002/0176462 A1 Nov. 28, 2002

(30) Foreign Application Priority Data

May 25, 2001 (EP) .............................................. 01304636

(51) Int. Cl.[7] .............................................. H01S 5/042
(52) U.S. Cl. ................................................. 372/38.02
(58) Field of Search ...................................... 372/38.02

(56) References Cited

U.S. PATENT DOCUMENTS 5,115,147 A 5/1992 Kusano et al.
5,796,767 A * 8/1998 Aizawa ........................ 372/38
6,097,159 A * 8/2000 Mogi et al. .................. 315/151
6,516,015 B1 * 2/2003 Kimura .................... 372/38.02

FOREIGN PATENT DOCUMENTS

| EP | 0495576 | 1/1992 |
| JP | 04054029 | 2/1992 |
| JP | 10145221 | 5/1998 |
| WO | WO 99/94542 | 7/1999 |

* cited by examiner

Primary Examiner—James W. Davie

(57) ABSTRACT

To drive a single-mode laser device using a differential-pair output stage, collector terminals of transistors forming the differential-pair must be maintained at a predetermined potential. Since the potential dropped across the laser device is only about 1V, a Schottky diode connected between a cathode of the laser device and a second supply rail raises the cathode about 0.5V above the voltage of the second supply rail.

16 Claims, 3 Drawing Sheets

OPTOELECTRONIC CIRCUIT AND CONTROL CIRCUIT

The present invention relates to electronic circuits of the types used in connection with driving an optoelectronic device, for example, a load circuit comprising a laser device, a driver circuit for the laser device, or an electronic device comprising the laser device. The present invention also relates to a control circuit apparatus for dynamically generating a voltage level.

It is known to drive a Vertical Cavity Surface Emitting Laser (VCSEL) using a driver circuit comprising a differential amplifier. The differential amplifier comprises a pair of transistors arranged with a current source to steer current to the VCSEL in response to a differential input signal. The VCSEL has a forward voltage associated therewith.

In contrast to the VCSEL, a forward voltage of a single-mode laser device is lower than the forward voltage of the VCSEL. Consequently, it is not possible to drive the single-mode laser device directly to a lower of two supply voltages (Vee), as is possible with the VCSEL, because the driver circuit lacks sufficient voltage headroom for both the pair of transistors and the current source.

The driver circuit can also comprise a pre-driving stage and an output stage; the output stage draws either no current, or a current equal to a required modulation current for the laser device. However, use of the pre-driving stage results in voltage values corresponding to LOGIC 0 and LOGIC 1 being sensitive to changes in an upper supply voltage. In such circumstances, the voltage values may vary in response to changes in the upper supply voltage.

According to a first aspect of the present invention, there is provided an electronic circuit apparatus comprising: a driving circuit coupled to a single-mode laser device, the driving circuit comprising an output stage, and the output stage comprising an output node for coupling to the single-mode laser device, wherein the single-mode laser device is arranged to maintain the output node at a predetermined potential, thereby ensuring that the single-mode laser is switched by the output stage at an optimum speed.

Preferably, the output stage comprises an active device.

Preferably, the apparatus further comprises means to electrically couple the single-mode laser device to the output stage.

Preferably, there is provided an apparatus, wherein the coupling means is arranged, when in use, to drop between 300 mV and 700 mV. More preferably, the coupling means is a diode.

Preferably, the coupling means comprises a metal-semiconductor junction and may be, for example, a Schottky diode. Alternatively, the diode comprises a p-n junction.

Preferably, the cathode of the single-mode laser device is coupled to the coupling means.

According to a second aspect of the present invention, there is provided a load circuit apparatus for coupling to an output stage of a driver circuit, the apparatus comprising a single-mode laser device and coupling means for maintaining an output node of the output stage at a predetermine potential, thereby ensuring that the single-mode laser is switched at an optimum speed.

According to a third aspect of the present invention, there is provided a driver circuit apparatus for a single-mode laser device, the apparatus comprising an output stage for coupling to the single-mode laser device, wherein the output stage comprises an output node that is maintained at a predetermined potential for ensuring that the single-mode laser is switched by the output stage at an optimum speed.

According to a fourth aspect of the present invention, there is provided the use of a diode for an output stage of a driving circuit for a single-mode laser device, the diode maintaining an output node of the output stage at a predetermined potential, thereby ensuring that the single-mode laser device is switched at an optimum speed.

It is thus possible to provide an electronic circuit apparatus, a load circuit apparatus, a driver circuit apparatus and a use of a diode that permit a single-mode laser device to be driven to the lower supply voltage. Additionally, speeds of falling edges of output current signals are improved. By employing DC coupling, it is thus also possible to avoid losses associated with AC coupling. Also, use of the Schottky diode results in any voltage shift across a range of currents flowing through the Schottky diode being lower than would be obtained if a resistor were used in place of the Schottky diode.

According to a fifth aspect of the present invention, there is provided a control circuit apparatus for dynamically generating a voltage level applied in a driving circuit, characterised by the control circuit comprising an active device operably coupled to voltage level generation means for generating the voltage level from a supply voltage, the voltage generation means being arranged to generate the voltage level in response to a degree of actuation of the active device, wherein the active device is driven in response to the supply voltage.

Preferably, the voltage level generation means is a resistance.

Preferably, the voltage level is inversely related to a reduction of the supply voltage by a voltage drop generated by the voltage level generation means.

Preferably, the active device is an amplifying device. More preferably, the amplifying device is a transistor.

According to a sixth aspect of the present invention, there is provided a driver circuit apparatus for an optoelectronic device comprising the control circuit apparatus.

It is thus also possible to provide a control circuit apparatus that permits an optimum DC bias voltage to be applied to the bases of the pair of transistors of the differential amplifier over a wider range of supply voltages. The above described driver circuit employing a current steering topology can thus be used to drive the single mode laser over a wider range of supply voltages than usually possible using known driver circuits.

At least one embodiment of the invention will now be described, by way of example only, with reference to the accompanying drawings, in which.

Throughout the following description, identical reference numerals shall be used to identify like parts.

Figure 1:
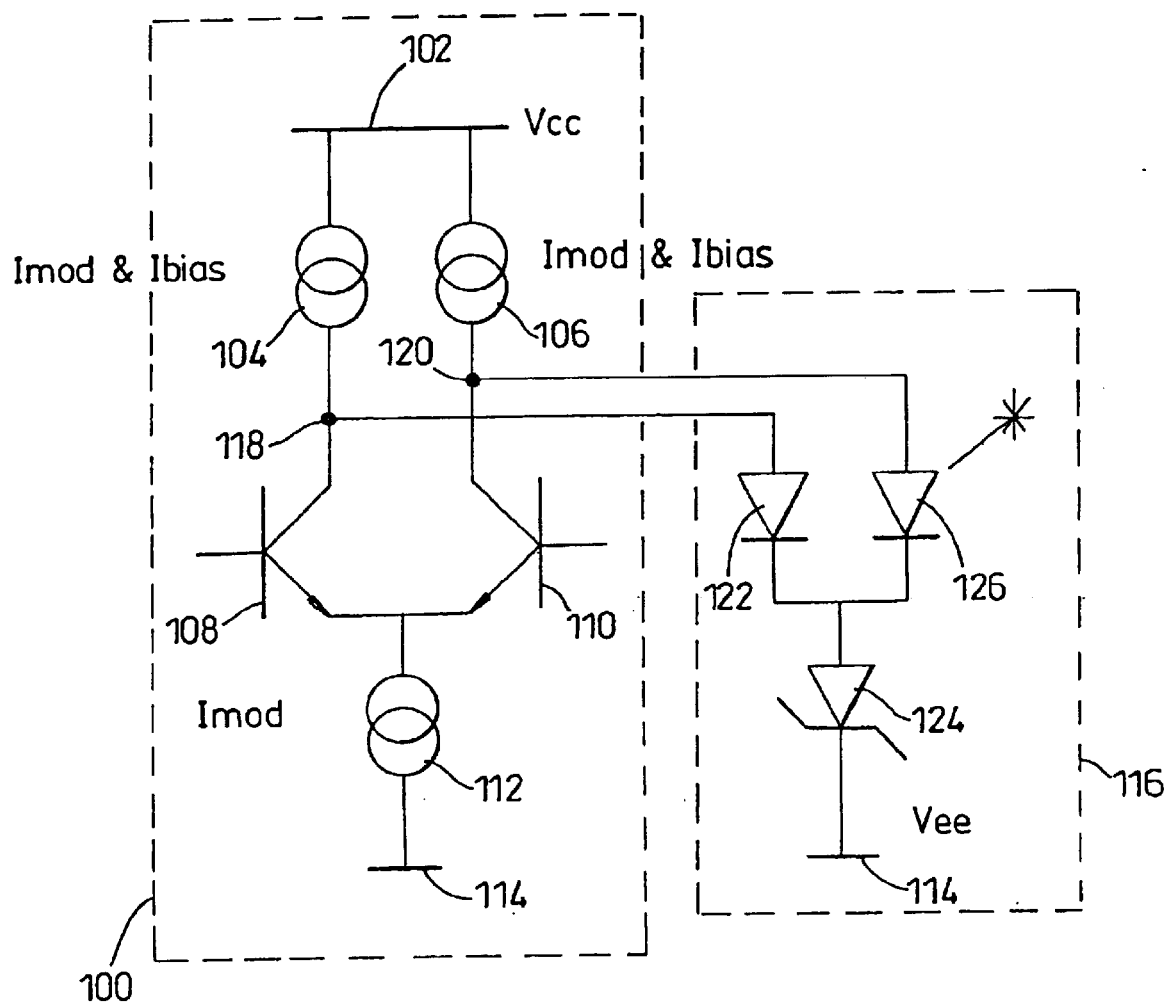
FIG. 1 is a schematic diagram of a load circuit coupled to an output stage of a driver circuit, and constituting an embodiment of the first to fourth aspects of the present invention.

The output stage 100 (FIG. 1) of a driver circuit (not shown in full in FIG. 1) comprises a first supply rail 102 for providing $V_{cc}$ volts. The first supply rail is coupled to a first terminal of a first current source 104 and a first terminal of a second current source 106. A second terminal of the first current source 104 is coupled to a collector terminal of a first NPN transistor 108, the first NPN transistor having a base terminal and an emitter terminal. The emitter terminal of the first NPN transistor 108 is coupled to an emitter terminal of a second NPN transistor 110. The second NPN transistor 110 comprises a base terminal and a collector terminal, the collector terminal of the second NPN transistor 110 being coupled to a second terminal of the second current source 106. The emitter terminals of the first and second transistors 108, 110 are coupled to a first terminal of a first current sink 112, a second terminal of the third current source 112 being coupled to a second supply rail 114. The second supply rail 114 provides a supply voltage of $V_{ee}$ volts, $V_{ee}$ being a lower potential than $V_{cc}$. The potential difference between the first and second supply rails 102,114 is, in this example, around 3.3V.

A load circuit 116 is coupled to the output stage 100 at a first node 118 and a second node 120. The first node 118 is located between the second terminal of the first current source 104 and the collector terminal of the first NPN transistor 108. The first node 118 is coupled to an anode of a dummy laser diode 122, a cathode of the dummy laser diode 122 being coupled to an anode of a Schottky diode 124.

The second node 120 is located between the second terminal of the second current source 106 and the collector terminal of the second NPN transistor 110. The second node 120 is coupled to an anode of a single-mode laser diode 126, a cathode of the single-mode laser diode 126 being coupled to the anode of the Schottky diode 124. A cathode of the Schottky diode 124 is coupled to the second supply rail 114.

In operation, the single-mode laser device 126 requires a forward voltage of approximately 1.5V to generate an optical signal of an intensity sufficient to represent a LOGIC 1 signal. In order for the intensity of the optical signal to be sufficient to represent a LOGIC 0 signal, the forward voltage of the single-mode laser device 126 needs to be approximately 1.0V. Hence, the above forward voltages corresponding to the LOGIC 1 and LOGIC 0 signals are generated by the output stage 100. Since the output stage 100 is configured as a differential amplifier, the operation of which is known in the art, the principle of operation of the output stage 100 will not be described further.

An amplified differential input signal is applied between the base terminals of the first and second NPN transistors 108, 110 and, in accordance with the known operation of the differential amplifier topology, a differential output signal is generated, which is applied between the anodes of the dummy laser diode 122 and the single-mode laser diode 126 and the second supply rail 114. Consequently, the dummy laser diode 122 and the single-mode laser diode 126 are driven to $V_{ee}$ via the Schottky diode 124. The Schottky diode 124 DC couples the output stage 100 to the dummy laser diode 122 and the single-mode laser diode 126. The dummy laser diode 122 acts as a dummy load for the output stage 100, the dummy load having the same electrical characteristics as the single-mode laser diode 126.

It should be appreciated that a minimum voltage drop of about 0.5V occurs across the first current sink 112 (responsible for providing a modulation current, $I_{mod}$), the first current sink 112 being an NPN current sink. Additionally, as is the case for transistors to operate normally within an active region, a base-emitter voltage needs to be present and so a bias voltage between 0.5V and 1.0V is usually applied between the bases and emitter terminals of the first and second NPN transistors 108, 110. Consequently, in order to prevent saturation of the first and/or second NPN transistor 108, 110, the potential between the collector terminals, when conducting, and the second supply rail 114 needs to be equal to or greater than a predetermined potential corresponding to the sum of the potential dropped between the second supply rail 114 and the base terminal of whichever of the first or second NPN transistors 108, 110 is conducting; if saturation of either of the first and second NPN transistor 108, 110 occurs, the switching speed of the saturated transistor will reduce. In order to prevent saturation of the first or second NPN transistors 108, 110, the Schottky diode 124 raises the potential at the cathodes of the single-mode laser diode 126 and the dummy laser diode 122 by approximately 0.5V above the supply voltage $V_{ee}$ of the second supply rail 114. Since a minimum voltage drop across the laser diodes 122, 126 is greater than approximately 1.0V, it can be seen that the potential at the collector terminals of the first and second NPN transistors 108, 110 will be held at more than approximately 1.5V, thereby preventing saturation and hence slowed switching of the first and second NPN transistors 108, 110.

It should be understood that, in this example, the first and second NPN transistors 108, 110 are Silicon-Germanium NPN transistors. Alternatively, Silicon transistors can be employed. However, if transistors formed from other materials are employed, such as Gallium Arsenide or Indium Phosphide, a different voltage drop across the first and second NPN transistors 108, 110 will result. Consequently, a suitably valued means for maintaining the output at a predetermined minimum potential, for example the Schottky diode 124, will need to be selected.

The small voltage dropped across the Schottky diode 124 provides a compromise between the voltage headroom requirements of the first and second transistors 108,110 and the first current sink 112, and the voltage headroom requirements of the first and second current sources 104,106. Consequently, the differential output signal is not saturated and high-speed switching of the single-mode laser diode 126 is possible.

Figure 2:
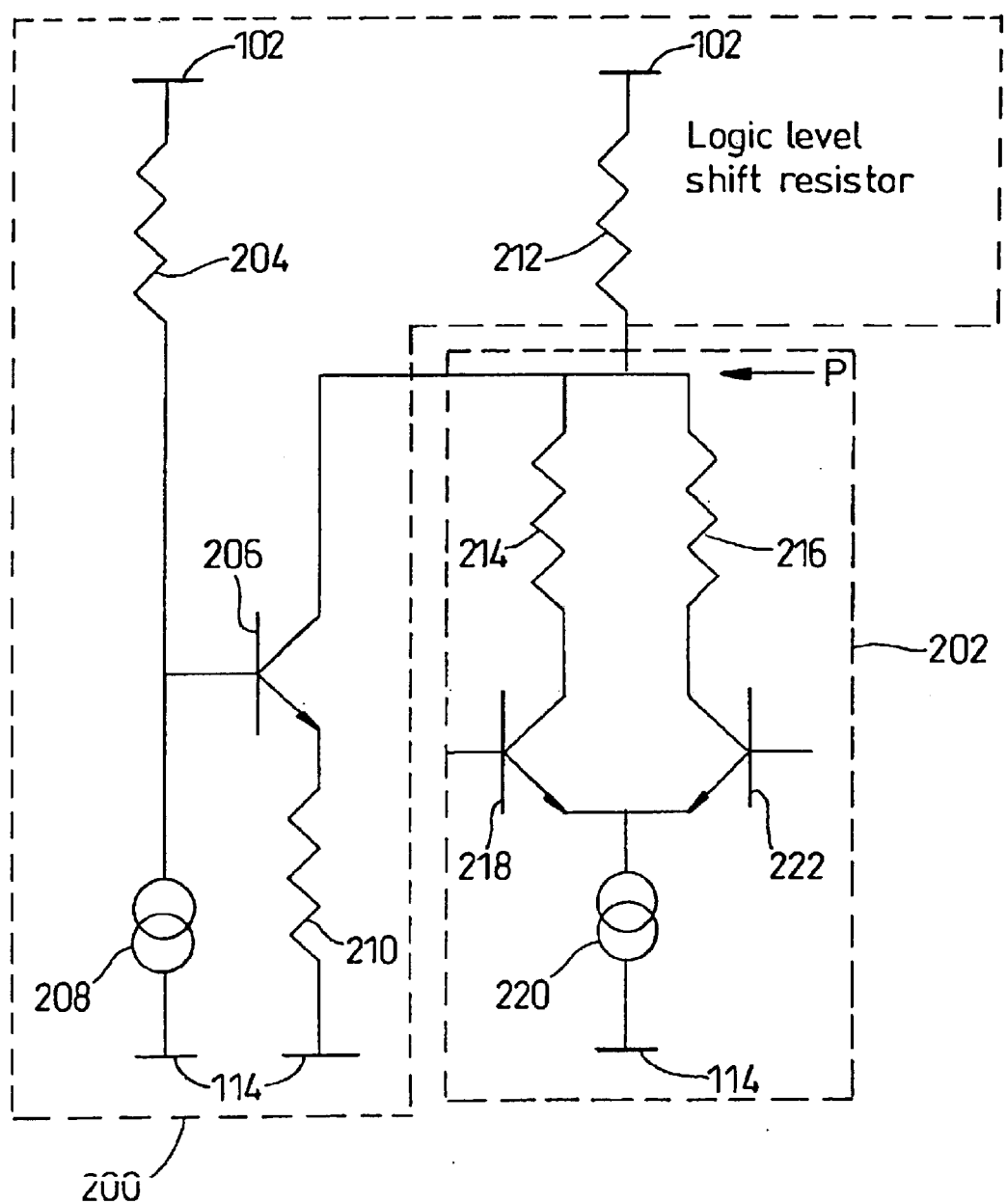
FIG. 2 is a schematic diagram of a control circuit constituting an embodiment of the fifth and sixth aspects of the present invention.

Referring to FIG. 2, a control circuit 200 coupled to an input stage 202 of the drive circuit (not shown in full in FIG. 2) comprises a first resistor 204 having a first terminal coupled to the first supply rail 102, and a second terminal coupled to a base terminal of a third NPN transistor 206 and a first terminal of a fourth current source 208. An emitter terminal of the third NPN transistor 206 is coupled to a first terminal of a second resistor 210, a second terminal of the second resistor 210 and a second terminal of the fourth current source 208 being coupled to the second supply rail 114.

A collector terminal of the third NPN transistor 206 is coupled to a first terminal of a third resistor 212, a second terminal of the third resistor 212 being coupled to the first supply rail 102. The collector terminal of the third NPN transistor 206 is also coupled to first terminals of a fourth resistor 214 and a fifth resistor 216 of the input stage 202. A second terminal of the fourth resistor 214 is coupled to a collector terminal of a fourth NPN transistor 218 having a base terminal, an emitter of the fourth NPN transistor 218 being coupled to a first terminal of a fifth current source 220. A second terminal of the fifth current source 220 is coupled to the second supply rail 114.

A second terminal of the fifth resistor 216 is coupled to a collector terminal of a fifth NPN transistor 222 having a base terminal, an emitter terminal of the fifth NPN transistor 222 being coupled to the first terminal of the fifth current source 220.

In operation, the fourth current source 208 causes a constant voltage drop (assuming a constant temperature) across the first resistor 204. Hence, if the voltage of the first supply rail 102 increases, the voltage at the base terminal of the third NPN transistor 206 also increases relative to $V_{ee}$, thereby causing the third NPN transistor 206 to conduct to a degree corresponding to the potential at the base terminal of the third NPN transistor 206 and in accordance with operational characteristics of the third NPN transistor 206. Conduction of the third NPN transistor 206 causes current be drawn depending upon the value of the second resistor 210 from the first supply rail 102 through the third resistor 212. It can therefore be seen that as the potential at the base terminal of the third NPN transistor 206 increases, a corresponding increase in voltage dropped across the third resistor 212 occurs, causing point P of the input stage 202 to remain at a substantially constant potential relative to the second supply rail 114. Hence, an increase in voltage provided by the first supply rail 102 does not result in a corresponding increase in potential across the input stage 202, and so driving voltage levels (corresponding to LOGIC 1 and LOGIC 0) generated by the input stage 202 remain substantially constant with respect to the supply voltage $V_{ee}$ provided by the second supply rail 114.

Figure 3:
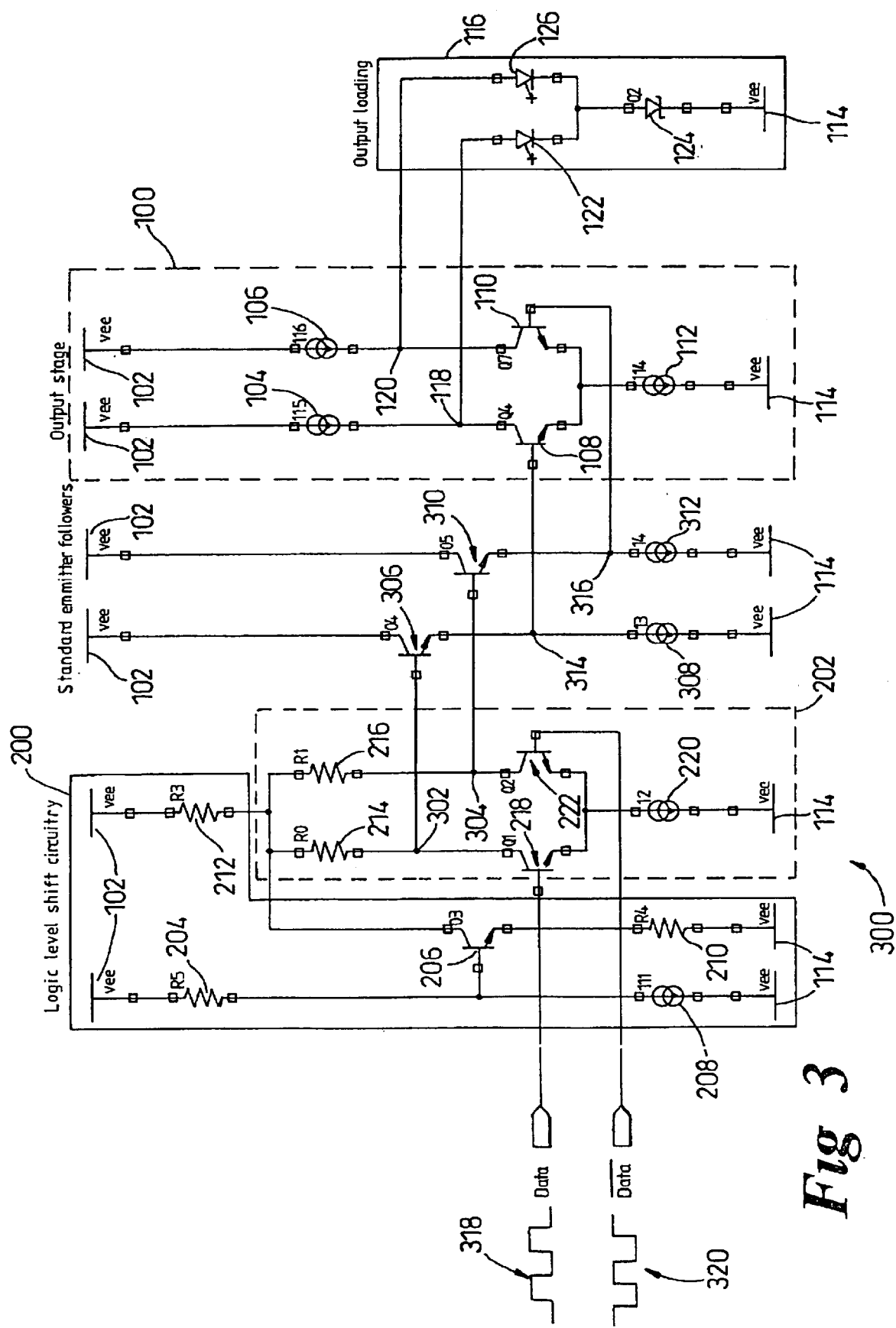
FIG. 3 is a schematic diagram of a driver circuit comprising the circuits of FIGS. 1 and 2.

Referring to FIG. 3, a driver circuit 300 for the single-mode laser device 126 comprises the control circuit 200 and input stage 202 as already described above in connection with FIG. 2. A third node 302 located between the fourth resistor 214 and the collector terminal of the fourth NPN transistor 218 is coupled to a base terminal of a sixth NPN transistor 306 of a first emitter follower, a collector terminal of the sixth NPN transistor 306 being coupled to the first supply rail 102, and an emitter terminal of the sixth NPN transistor 306 being coupled to a first terminal of a sixth current source 308; a second terminal of the sixth current source 308 is coupled to the second supply rail 114. Similarly, a fourth node 304 is located between the fifth resistor 216 and the collector terminal of the fifth NPN transistor 222. The fourth node 304 is coupled to a base terminal of a seventh NPN transistor 310 of a second emitter follower, the seventh NPN transistor 310 having a collector terminal coupled to the first supply rail 102 and an emitter terminal coupled to a first terminal of a seventh current source 312; a second terminal of the seventh current source 312 is coupled to the second supply rail 114.

A fifth node 314 is located between the emitter terminal of the sixth NPN transistor 306 and the first terminal of the sixth current source 308. Similarly, a sixth node 316 is located between the emitter terminal of the seventh NPN transistor 310 and the first terminal of the seventh current source 312.

The driver circuit 300 also comprises the output stage 100 and the load circuit 116 described above in connection with FIG. 1. The fifth and sixth nodes 314, 316 are coupled to the base terminals of the first and second NPN transistors 108, 110, respectively.

In operation, the control circuit 200 of the driver circuit 300 operates in the same manner as already described above in connection with FIG. 2. Hence, the potential across the input stage 202 is maintained at a substantially constant level.

A data signal 318 and an inverted data signal 320, in this example corresponding to a bit stream, are provided at the base terminals of the fourth and fifth NPN transistors 218, 222 and constitute a differential input signal. The input stage 202 amplifies the differential input signal resulting in a first amplified data signal and a second amplified inverted data signal at the fourth and fifth nodes 302, 304, respectively, the first amplified data and the first inverted data signals constituting a pre-amplified differential input signal. Operation of the differential amplifier that is the input stage 202 is known in the art and so will not be described in further detail.

The first amplified data signal and the first inverted data signal are respectively amplified by the first and second emitter followers to yield a second amplified data signal and a second amplified inverted data signal at the sixth and seventh nodes 314, 316, respectively. The second amplified data signal and the second amplified inverted data signal constitute the amplified differential input signal applied to the first and second NPN transistors 108, 110 of the output stage 100, the operation of which has already been described above, in order to drive the single-mode laser device 126.

It should be appreciated that although the above described circuits are described in the context of interconnected discrete components and devices, the above circuits can be formed as one or more Integrated Circuit (IC).

What is claimed is:

1. An electronic circuit apparatus comprising: a driver circuit coupled to a single-mode laser device, the driver circuit comprising an output stage, and the output stage comprising an output node for coupling to the single-mode laser device, and a controller for maintaining the output node at a predetermined minimum potential for enabling switching of the single-mode laser by the output stage without saturating a driver transistor of the single mode laser device.

2. An apparatus as claimed in claim 1, wherein the output stage comprises an active device.

3. An apparatus as claimed in claim 1 further comprising coupling means to DC couple the single-mode laser device to the output stage.

4. An apparatus as claimed in claim 3, wherein the coupling means is arranged, when in use, to drop between 300 mV and 700 mV there across.

5. An apparatus as claimed in claim 3, wherein the coupling means comprises a metal-semiconductor junction.

6. An apparatus as claimed in claim 5, wherein the diode is a Schottky diode.

7. An apparatus as claimed in claim 3, wherein the cathode of the single-mode laser device is coupled to the coupling means.

8. An electronic circuit apparatus comprising: a driver circuit coupled to a single-mode laser device, the driver circuit comprising an output stage, and the output stage comprising an output node for coupling to the single-mode laser device, and a controller for maintaining the output node at a predetermined minimum potential for enabling switching of the single-mode laser by the output stage, and circuitry for DC coupling the single-mode laser device to the output stage, the coupling circuitry including a diode.

9. A load circuit apparatus for coupling to an output stage of a driver circuit, the apparatus comprising a single-mode laser device, coupling circuitry for maintaining an output node of the output stage at a predetermined minimum potential for enabling switching of the single-mode laser device without saturating a driver transistor of the single mode laser device.

10. A driver circuit apparatus for a single-mode laser device, the apparatus comprising an output stage for coupling to the single-mode laser device, wherein the output stage comprises an output node, the output node being arranged to be maintained at a predetermined minimum potential for enabling switching of the single-mode laser device by the output stage without saturating a driver transistor of the single mode laser device.

11. A method of using a diode for an output stage of a driver circuit for a single-mode laser device, comprising causing the diode to maintain an output node of the output stage at a predetermined minimum potential that enables switching of the single-mode laser device without saturating a driver transistor of the single mode laser device.

12. In combination, an optical communication network, the communication network including an electronic circuit, the electronic circuit including the apparatus of claim 1.

13. In combination, a single-mode laser diode, a transistor driver circuit having first and second output terminals (a) for deriving first and second complementary signals, and (b) respectively connected to the laser diode and a dummy laser diode for causing the laser diode and the dummy laser diode to be turned on and off in a complementary manner by the first and second complementary signals, and a circuit element connected to the diodes for controlling the voltage applied to the laser diode and for preventing saturation of a transistor of the driver circuit, the transistor being connected for driving the laser diode.

14. The circuit of claim 13 wherein the circuit element includes a Schottky diode.

15. The circuit of claim 14 wherein the dummy laser diode and the single-mode laser diode include (a) first electrodes of the same first polarity respectively connected to the first and second output terminals and (b) second electrodes of the second polarity connected to a first electrode of the first polarity of the Schottky diode, a second electrode of the second polarity of the Schottky diode being connected to a power supply terminal.

16. The circuit of claim 15 wherein the driver circuit is arranged for causing the voltages at the first and second output terminals to be alternately substantially the same as the voltage of the power supply voltage, the Schottky diode being arranged for maintaining the voltage at the second electrode of laser diode sufficiently high to prevent saturation of the transistor of the driver circuit for driving the laser diode.

\* \* \* \* \*